(12) United States Patent
Yeh et al.

(10) Patent No.: US 7,403,058 B2
(45) Date of Patent: Jul. 22, 2008

(54) TEST CLOCK GENERATING APPARATUS

(75) Inventors: Ta-Chia Yeh, Hsinchu (TW);
Chien-Kuang Lin, Taipei (TW);
Chi-Feng Wu, Kaohsiung (TW)

(73) Assignee: Realtek Semiconductor Corporation, Hsinchu (TW)

( * ) Notice: Subject to any disclaimer, the term of this patent is extended or adjusted under 35 U.S.C. 154(b) by 376 days.

(21) Appl. No.: 11/192,279

(22) Filed: Jul. 29, 2005

(65) Prior Publication Data

US 2006/0026477 A1    Feb. 2, 2006

(30) Foreign Application Priority Data

Jul. 30, 2004    (TW) .............................. 93122961 A

(51) Int. Cl.
*G06F 1/04*    (2006.01)
(52) U.S. Cl. .................. 327/291; 327/293; 327/407
(58) Field of Classification Search ............... 327/291, 327/293, 294, 298, 407, 408, 99, 165, 166
See application file for complete search history.

(56) References Cited

U.S. PATENT DOCUMENTS

| | | | | |
|---|---|---|---|---|
| 5,524,114 A | * | 6/1996 | Peng ........................... | 714/724 |
| 5,783,960 A | * | 7/1998 | Lackey ........................ | 327/295 |
| 6,452,435 B1 | * | 9/2002 | Skergan et al. ............... | 327/293 |
| 7,131,041 B2 | * | 10/2006 | Ozaki .......................... | 714/724 |
| 7,197,725 B2 | * | 3/2007 | Takeoka et al. ................ | 716/4 |

* cited by examiner

*Primary Examiner*—N. Drew Richards
*Assistant Examiner*—Hai L. Nguyen
(74) *Attorney, Agent, or Firm*—Birch, Stewart, Kolasch & Birch, LLP

(57) ABSTRACT

A test clock generating apparatus is provided in the invention. The test clock generating apparatus includes an at-speed clock generator and a multiplexer. The at-speed clock generator is for receiving a reference clock signal and a scan chain enable signal and outputting an at-speed clock signal. The frequency of the at-speed clock signal is substantially the same with that of the reference clock signal. The multiplexer is for receiving the at-speed clock signal and a scan chain clock signal and outputting a test clock signal according to the scan chain enable signal. The frequency of the reference clock signal is higher than that of the scan chain clock.

20 Claims, 6 Drawing Sheets

TEST CLOCK GENERATING APPARATUS

This application claims the benefit of Taiwan application Serial No. 93122961, filed Jul. 30, 2004, the subject matter of which is incorporated herein by reference.

BACKGROUND OF THE INVENTION

1. Field of the Invention

The invention relates in general to an integrated circuit, and more particularly to an integrated circuit including a test clock generating circuit.

2. Description of the Related Art

As designed and manufactured, digital logic circuits requires a suitable apparatus for circuit debugging and testing. A common digital logic circuit, as shown in FIG. 1 includes combinational logic circuits and sequential circuits. The combinational logic circuits 10~16 generate output signals according to the present input signal. The sequential circuits, such as the flip-flops D1~D6, can memorize and generate output signals according to the previous input signal, wherein the scan-chain signal sclk is a test clock signal.

The conventional method for testing a digital logic circuit is to serially couple a plurality of flip-flops as a scan chain. By doing this, the digital logic circuit can be debugged by recording specific logic values in the scan chain in order. This method is also called a scan test. The circuit can be selected to operate in a shift mode or a normal mode according to a plurality of multiplexers mu1~mux6, and scan enable signals SE. When the circuit is operated in the shift mode (SE=1), the test pattern is scanned in from the tester and stored in the flip-flops D1~D6. Afterwards, when the circuit enters the normal mode (or called capture mode) (SE=0), the values stored in the flip-flops D1~D6 are sent to the combinational logic circuits 10~16 to simulate the logic calculation under normal operational conditions, and the calculation results are stored in each flip-flop D1~D6. Lastly, the circuit enters the shift mode again where the test results can be scanned out in order by the serially coupled flip-flop scan chain so as to check whether the function of the chip is normal or not.

In these few years, the operational clock loading of the chip has largely been enhanced from several tens MHz to several hundreds MHz, however, the chip cannot still be tested at speed for the scan clock provided by the tester is not enhanced accordingly. Even there are a few new testers, which can provide high-speed (at-speed) clocks, their cost in present is still expensive, thereby not meeting the cost benefit. Moreover, when the operational frequency of the interior circuits of the chip is faster than that of the input/output (I/O) circuit of the chip, it is difficult to test the chip at speed because the I/O circuit of the chip cannot operate normally in the high-speed (at speed) clock.

SUMMARY OF THE INVENTION

It is therefore an object of the invention to provide a test clock generating circuit by which each interior circuit of the to-be-tested chip can be tested at speed by its corresponding operational clock.

It is therefore another object of the invention to provide a clock generating circuit of a chip applied in a scan chain test for generating an at speed test clock signal.

The invention achieves the above-identified object by providing a test clock generating apparatus. The test clock generating apparatus includes an at-speed clock generator and a multiplexer. The at-speed clock generator is for receiving a reference clock signal and a scan chain enable signal and outputting an at-speed clock signal. The frequency of the at-speed clock signal is substantially the same with that of the reference clock signal. The multiplexer is for receiving the at-speed clock signal and a scan chain clock and outputting a test clock signal according to the scan chain enable signal. The frequency of the reference clock signal is higher than that of the scan chain clock.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 2:
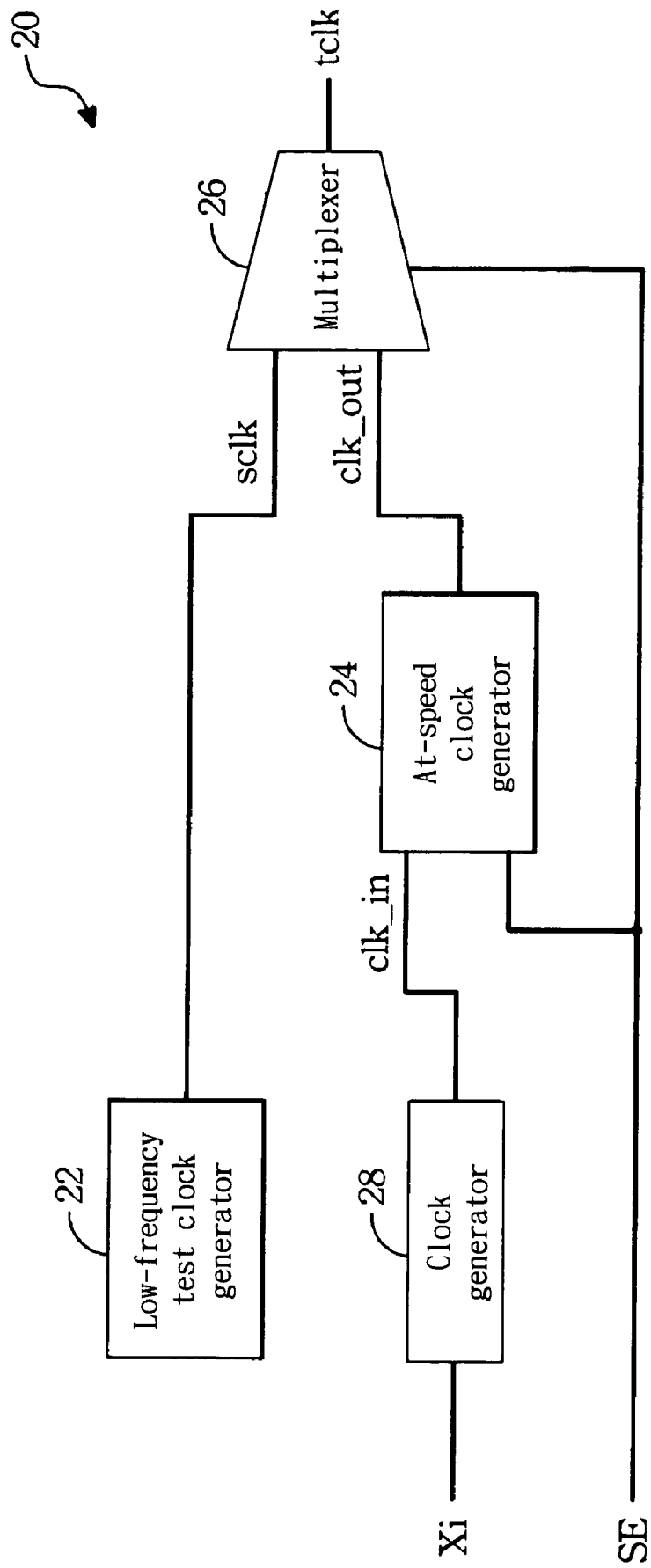
FIG. 2 is a schematic circuit block diagram of a test clock generating apparatus according to a preferred embodiment of the invention.

Referring to FIG. 2, a schematic circuit block diagram of a test clock generating apparatus according to a preferred embodiment of the invention is shown. The test clock generating circuit 20 of the invention includes a low-frequency test clock generator 22, an at-speed clock generator 24 and a multiplexer 26. When the chip is in the shift mode, the test clock generating circuit 20 outputs a low-frequency scan-chain clock sclk as a test signal tclk. When the scan chain enable signal SE is at a high level (SE=1) and the chip is in the normal mode, the test clock generating circuit 20 output an at-speed clock signal having the same operational frequency with the to-be-tested chip as the test signal when the signal SE is at a low level (SE=0).

The low-frequency test clock generator 22 is for providing a scan chain clock sclk. The scan chain clock can be provided by the external tester or be generated by the chip itself. The at-speed clock generator 24 includes an at-speed clock (clk_in) input terminal, a scan chain enable signal (SE) input terminal and a clk_out output terminal. The at-speed clock (clk_in) can be provided by the clock generator 28 in the chip, which is usually a phase-locked-loop (PLL) or a Delay-locked-loop (DLL). In a preferred embodiment, the clock generator 28 is an operation frequency clock generator of the chip.

Figure 3:
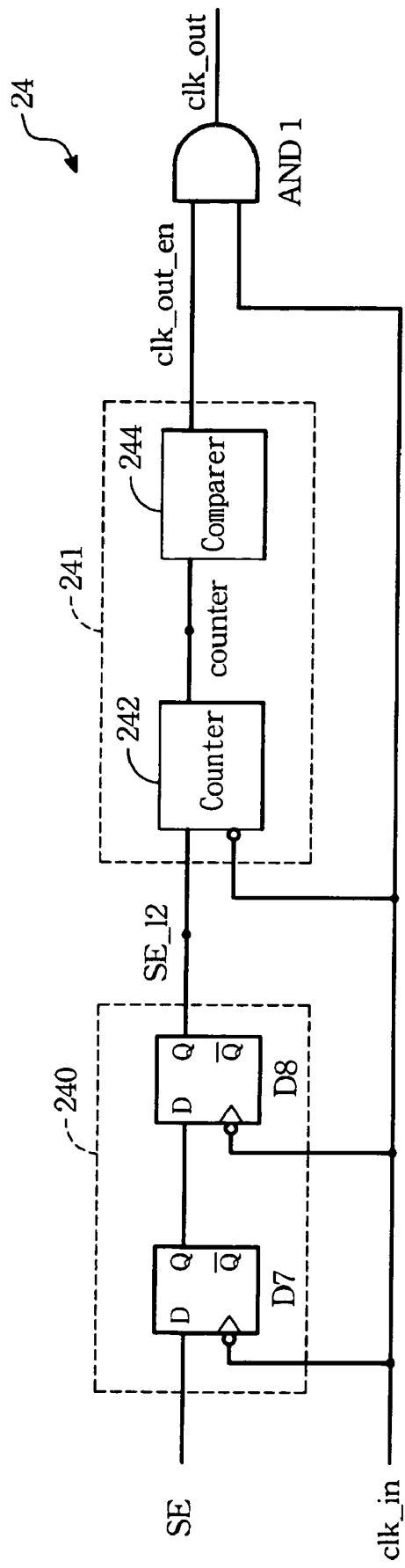
FIG. 3 is a schematic block diagram of the at-speed clock generator according to the preferred embodiment of the invention.

Referring to FIG. 3, a schematic block diagram of the at-speed clock generator according to the preferred embodiment of the invention is shown. The at-speed clock generator 24 includes at least a flip-flop (synchronizer) 240 and a pulse controller 241, while the pulse controller 241 includes a counter 242 and a comparer 244. In the embodiment, the flip-flop 240 and the counter 242 are operated according to the same clock signal clk_in. In another embodiment, the flip-flop 240 is formed by serially coupling the two flip-flops D7 and D8. When the test clock generating circuit is changed from the shift mode to the normal mode, the counter 242 is enabled by the flip-flop 240 and counts the pulse of the at-speed signal (clk_in). In an embodiment, the counter 242 in the embodiment of the invention is a binary counter. However, any other counter such as a gray code counter can also be applied to the device 242 of the invention.

For, example, when the counter 242 starts to count, by using the comparer 244, an at-speed enable signal clk_out_en is output at the count of 1 and 2. Then, an AND-gate (AND1) logic calculation is performed on the scan-chain enable signal SE and the at-speed clock clk_in to generate an at-speed clock clk_out which has dual pulse signal. Referring to the timing diagram of FIG. 4, in the embodiment, the frequency of scan-chain clock sclk and at-speed clock clk_in is respectively 10 MHz and 200 MHz. In a preferred embodiment, the bit number of the counter is designed to just have enough count pulse number. In another embodiment, when the count of the counter reaches a maximum, the count stops increasing and is not reset to 0 so as to prevent malfunction of the counter at the unpredicted count value.

Figure 5:
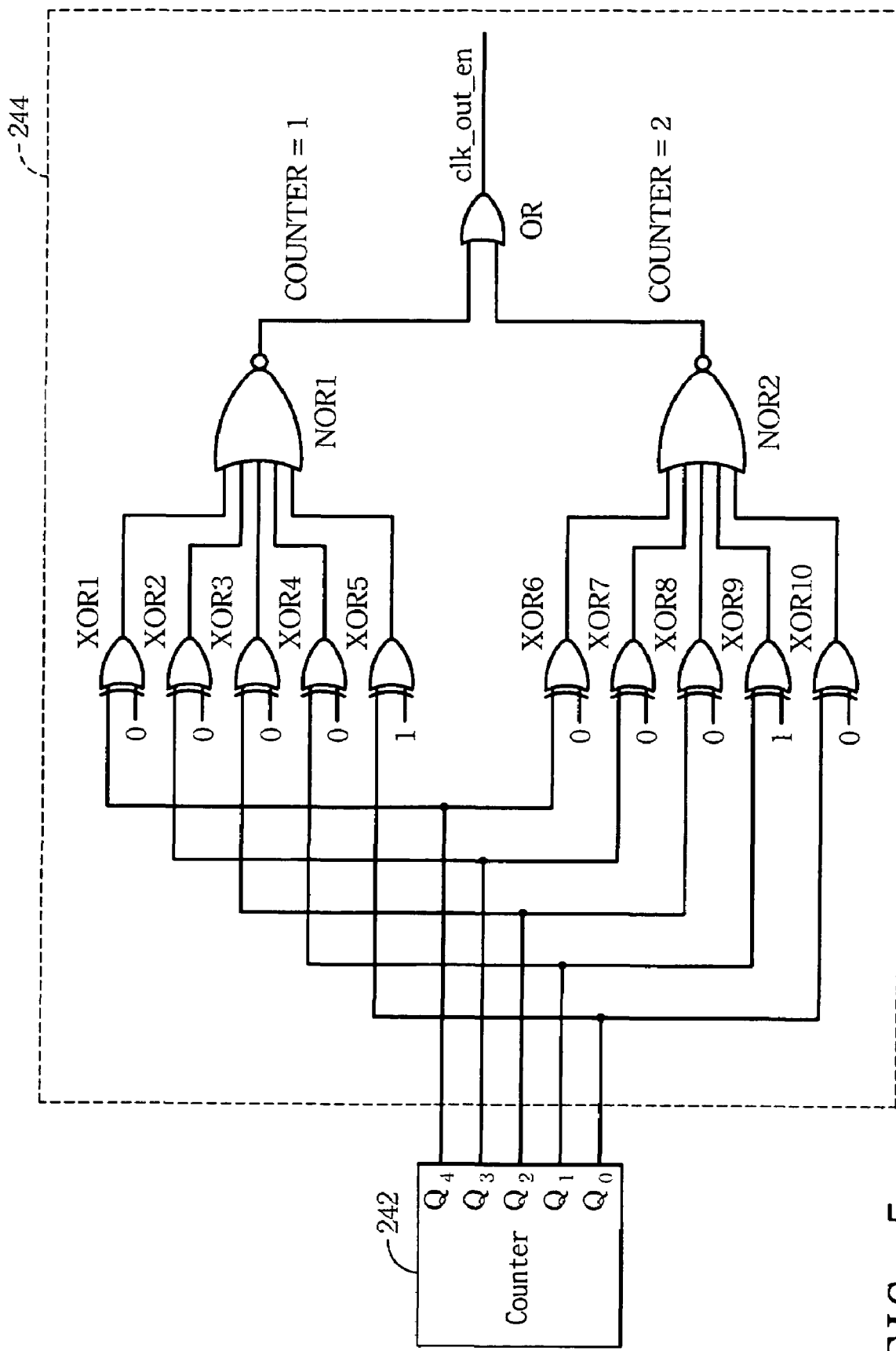
FIG. 5 is a block diagram of the interior circuit of the comparer according to the embodiment of the invention.

In addition, referring to FIG. 5, a detailed block diagram of the comparer 244 according to the embodiment of the invention is shown. In the embodiment, when the comparer 244 receives the count vale sent from the five-bit (Q0~Q4) counter 242, a high at-speed clock enable signal clk_out_en can be output at the count of 1 and 2 via the Exclusive-OR gates XOR1~XOR10, Not-OR gates NOR1, NOR2, and an OR gate OR. As mentioned above, although outputting an at-speed clock enable signal clk_out_en at the count of 1 and 2 is taken as an embodiment, the comparer 244 can also be set to output the at-speed clock enable signal clk_out_en at the count of 5, 6 or other values according to the method of the invention. Of course, according to the invention, the at-speed clock enable signal clk_out_en can also be output at the count of 1, 2, 3, for generating an at-speed output clock clk_out which has triple pulse signal through the logic calculation of the AND1. In other words, by the counter setting, the pulse number of the at-speed clock signal clk_out can be controlled.

Figure 4:
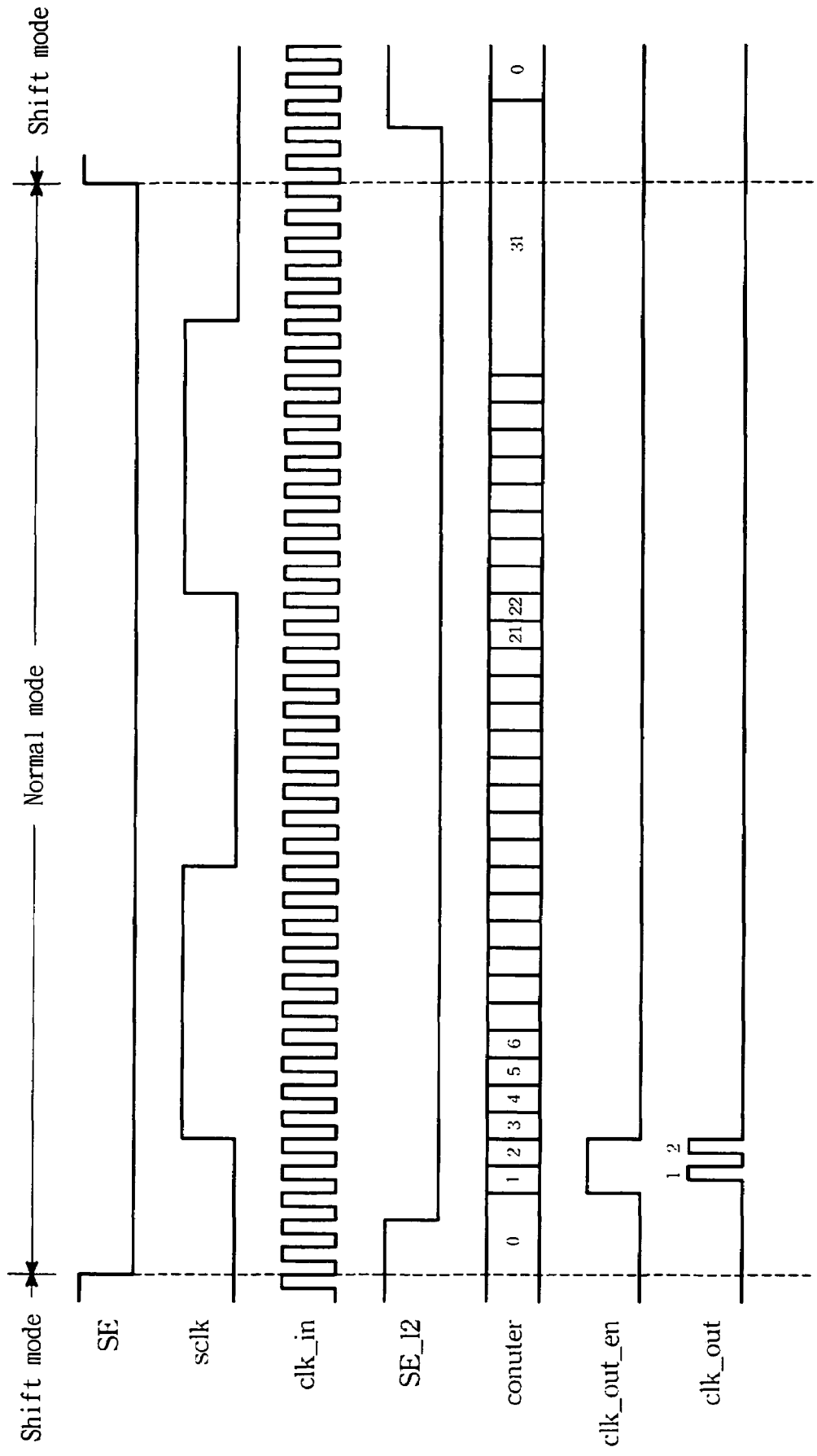
FIG. 4 is the timing diagram according to FIG. 3.

As shown in FIG. 4, when the SE value is changed from 1 to 0, representing changed from the shift mode to the normal mode, the output signal of the test clock generating circuit 20 is changed from the scan-chain clock sclk to at-speed output clock clk_out. The output signal SE_12 (synchronization clock signal) of the flip-flop 240 after delaying a small period of time, is also changed from 1 to 0, meanwhile the counter 242 is reset and counts up from 0 according to the frequency of the at-speed clock clk_in. When the count is 1 and 2, via the comparer 244, an at-speed enable signal clk_out_en is output and logically calculated with the at-speed clock clk_in through an and-gate AND1 to generate an at-speed output clock clk_out having dual pulse (including the pulse 1 and the pulse 2). Finally, when the SE value is changed from 0 to 1, returning the shift mode, it represents the test identification results are ready to be read so as to compare the test results with the predicted logic calculation result.

Figure 1:
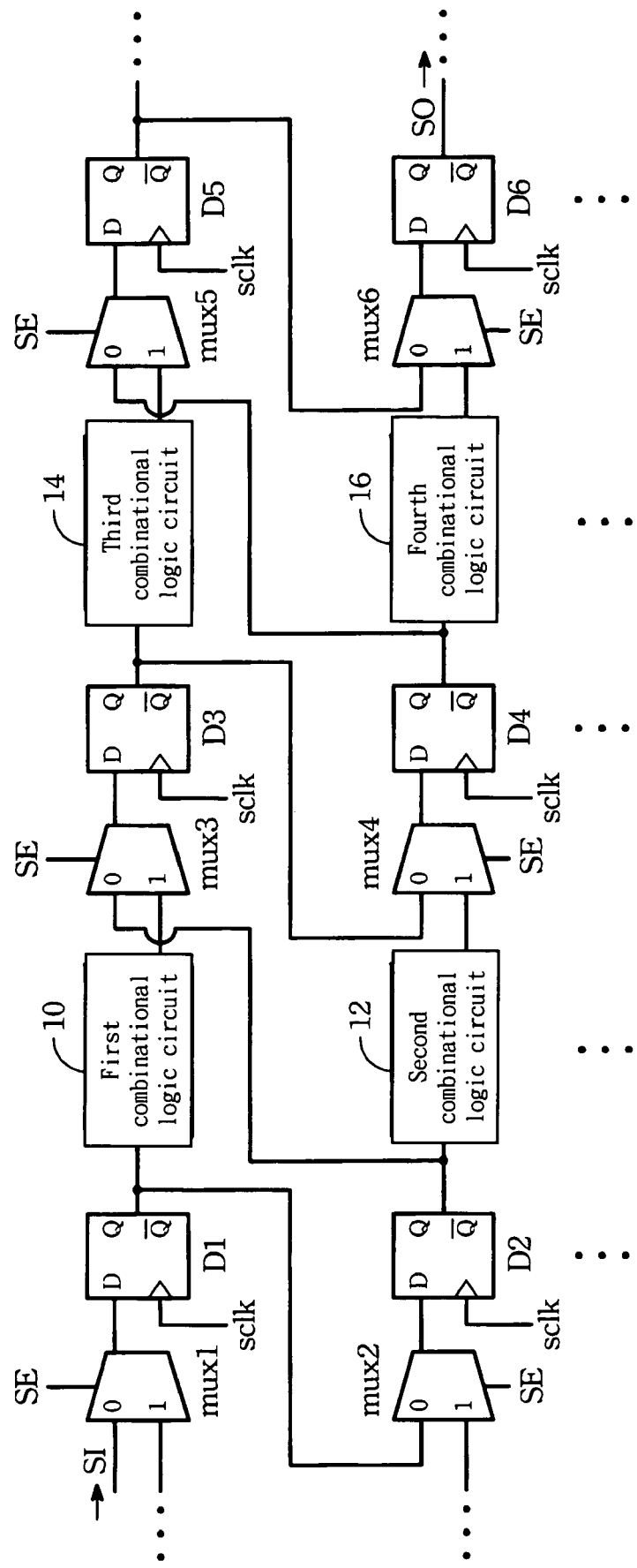
FIG. 1 (Prior Art) is a partial schematic diagram of a specific function circuit.

Therefore, in the test process of using the at-speed clock testing dual pulse signal of the invention as a test signal as shown in FIG. 1, at the shift mode (SE=1), the test pattern is scanned in and stored in the flip-flops D1~D6 from the tester according to the test clock signal tclk (or scan chain clock signal sclk). That is, the test clock signal tclk is the scan-chain clock sclk in the shift mode. Afterward, when the normal mode is entered at SE=0 (that is, the test clock signal tclk is the at-speed output clk_out in the normal mode), through the triggering of the pulse 1 in the at-speed output clock clk_out, the values stored in the flip-flops D1~D6 are respectively launched to the first combination logic circuit 10~the fourth combination logic circuit 16 to simulate the logic calculation under normal operational conditions and then the calculation results are stored again into each flip-flops D1~D6.

Figure 6:
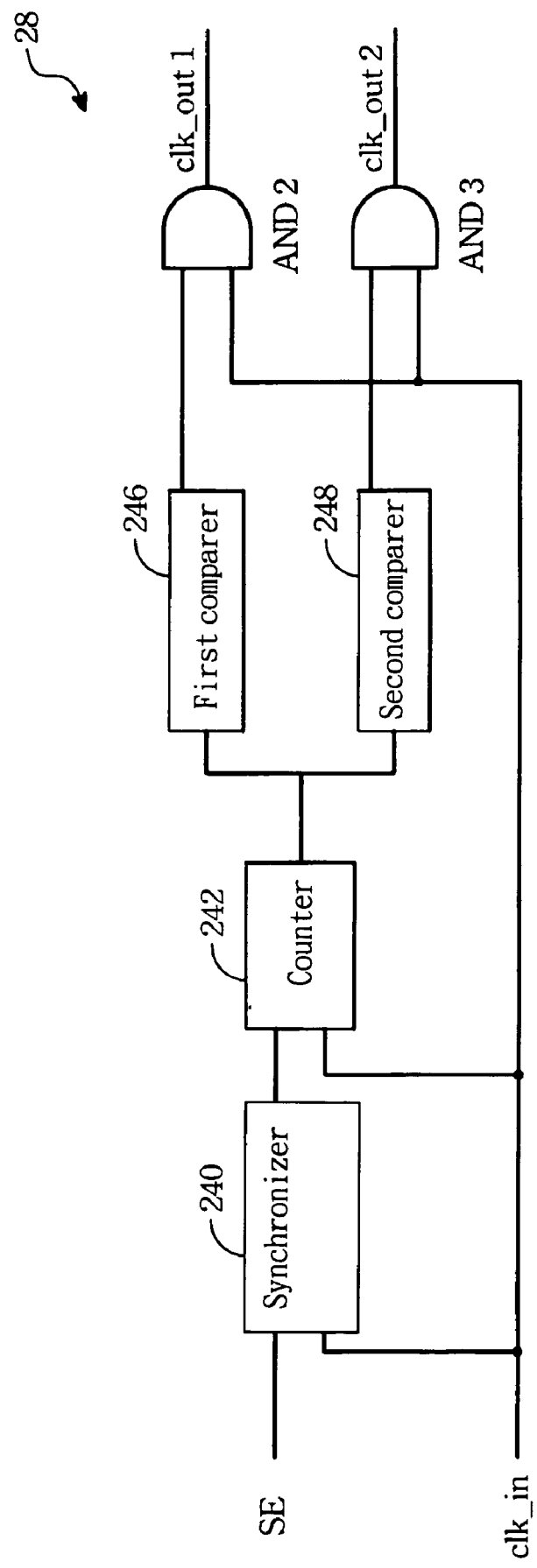
FIG. 6 is a schematic circuit block diagram of the at-speed clock generator according to another embodiment of the invention.

As shown in FIG. 6, the circuit of the invention is not limited to generating a set of at-speed testing dual pulse signal. For example, two or more than two sets of at-speed testing dual pulse signals can be provided by setting two or more than two comparers (the first comparer 246 and the second comparer 248). As shown in FIG. 6, the first comparer 246 outputs the at-speed testing pulse signal clk_out1 as the count of the at-speed clock specific pulse generator 28 is 1 and 2; while the second comparer 246 outputs the at-speed testing pulse signal clk_out2 as the count of the at-speed clock specific pulse generator 28 is 3 and 4.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An apparatus for generating a test clock signal in a chip, the apparatus comprising:
    a first clock generator, for outputting a first clock signal, wherein the first clock generator comprises:
    at least one flip-flop, for receiving a reference clock signal and outputting a synchronized signal according to a scan chain enable signal; and
    a pulse controller, coupled to the at least one flip-flop, for controlling a pulse number of the reference clock signal according to the synchronized signal and accordingly outputting the first clock signal; and
    a multiplexer, for receiving the first clock signal, a scan chain clock, and selecting one of the first clock signal and the scan chain clock to output the test clock signal according to the scan chain enable signal;
    wherein the frequency of the first clock signal is higher than that of the scan chain clock.

2. The apparatus of claim 1, wherein the frequency of the first clock signal is substantially the same with an operational frequency of the chip.

3. The apparatus of claim 1, wherein the scan chain clock is generated by an exterior tester.

4. The apparatus of claim 1, wherein the first clock generator comprises a phase-locked loop (PLL) for generating the reference clock signal.

5. The apparatus of claim 1, wherein the pulse controller comprises:
    a counter, for controlling the pulse number of the reference clock signal according to the synchronized signal and outputting a count value;
    a first circuit, coupled to the counter for outputting a first sub-clock signal according to the count value and the reference clock signal; and
    a second circuit, coupled to the counter for outputting a second output clock according to the count value and the reference clock signal, wherein the first clock signal comprises the first sub-clock signal and the second sub-clock signal.

6. The apparatus of claim 1, wherein the pulse controller comprises a counter and a comparer.

7. The apparatus of claim 1, wherein the test clock signal comprises components of the first clock signal when the apparatus is in a normal mode, and the test clock signal comprises components of the scan chain clock when the apparatus is in a shift mode.

8. The apparatus of claim 1, wherein the apparatus has a shift mode and a normal mode.

9. The apparatus of claim 8, wherein the test clock signal is substantially the same with the scan chain clock in the shift mode.

10. The apparatus of claim 8, wherein the test clock signal comprises at least a pulse signal, and the frequency of the pulse signal is substantially the same with the operational frequency of the chip when the apparatus is in the normal mode.

11. A method of generating a test clock signal for testing a chip, the method comprising:
   generating a synchronized signal according to a reference clock signal and a scan chain enable signal;
   controlling a pulse number of the reference clock signal according to the synchronized signal and accordingly generating an internal clock signal;
   receiving a scan chain clock; and
   outputting the test clock signal according to the scan chain enable signal; wherein the test clock signal comprises components of the internal clock signal and the scan chain clock.

12. The method of claim 11, wherein the frequency of the internal clock signal is higher than the frequency of the scan chain clock.

13. The method of claim 11, wherein the frequency of the internal clock signal is substantially the same with an operational frequency of the chip.

14. The method of claim 11, wherein the step of controlling the pulse number of the reference clock signal further comprises;
   counting the pulse number of the reference clock signal according to the synchronized signal to generate a count value; and
   generating the internal clock signal according to the count value and the reference clock signal.

15. The method of claim 11, wherein when the scan chain enable signal is in a shift mode, the test clock signal is substantially the same with the scan chain clock.

16. The method of claim 11, wherein when the scan chain enable signal is in a normal mode, the test clock signal comprises at least a pulse signal, and the frequency of the pulse signal is substantially the same with the operational frequency of the chip.

17. An apparatus for generating a test clock signal in a chip, the apparatus comprising:
   an input terminal, for receiving a scan chain clock; and
   a test clock generator, coupled to the input terminal, for receiving the scan chain clock, generating a synchronized signal according to a reference clock signal and a scan chain enable signal, controlling a pulse number of the reference clock signal according to the synchronized signal to produce a first output clock, and selecting one of the first output clock and the scan chain clock to output the test clock signal comprising a first frequency and a second frequency;
   wherein when the apparatus is in a normal mode, the first frequency of the test clock signal and an operational frequency of the chip are substantial the same; and when the apparatus is in a shift mode, the second frequency of the test clock signal and that of the scan chain clock are substantial the same.

18. The apparatus of claim 17, further comprising:
   a phase locked loop (PLL) for generating the reference clock to the test clock generator, wherein the frequency of the reference clock and the first frequency of the test clock signal are substantial the same.

19. The apparatus of claim 17, wherein the test clock generator comprises:
   a counter for controlling a pulse number of the reference clock signal and accordingly outputting a count value; and
   a first circuit, coupled to the counter for outputting the first output clock according to the count value and the reference clock signal.

20. The apparatus of claim 19, wherein the test clock generator further comprises:
   a second circuit, coupled to the counter for outputting a second output clock according to the count value and the reference clock signal, wherein the test clock generator selects one of the first output clock, the second output clock and the scan chain clock to output the test clock signal.

* * * * *